United States Patent
Kito

Patent Number: 6,035,112
Date of Patent: Mar. 7, 2000

[54] CELL LIBRARY GENERATING METHOD AND APPARATUS

[75] Inventor: Nobuyuki Kito, Kasugai, Japan

[73] Assignee: Fujitsu Limted, Kawasaki, Japan

[21] Appl. No.: 08/811,529

[22] Filed: Mar. 4, 1997

[30] Foreign Application Priority Data

Mar. 18, 1996 [JP] Japan ..................................... 8-061320

[51] Int. Cl.[7] .................................................. G06F 17/50
[52] U.S. Cl. ...................................................... 395/500.19
[58] Field of Search ..................................... 364/578, 200, 364/489, 488; 395/500, 500.19

[56] References Cited

U.S. PATENT DOCUMENTS 5,416,719  4/1995  Peibitich ................................ 364/489

OTHER PUBLICATIONS

Paper by Takamine, Miyamoto, Nagashima, Miyoshi and Kawab titled Clock Event Suppression Algorithm fo Velvet and its Appliation to S–820 Development, 25th ACM/IEEE Design Automation Conference pp 716–719, 1988.

*Primary Examiner*—Kevin J. Teska
*Assistant Examiner*—Lonnie A. Knox
*Attorney, Agent, or Firm*—Staas & Halsey LLP

[57] ABSTRACT

A method and apparatus for generating a library for use in a logic simulator. The library includes information on a plurality of cells whose functions are expressed in accordance with a truth table model by combining patterns of input signals and output signals. Information on each cell is input to the logic simulator. It is determined if an input signal to each cell includes an edge signal indicative of rising or falling of that input signal. When the input signal includes the edge signal, the pattern is selected. The selected pattern is then separated from the truth table model of the cell and is developed into two patterns. The developed two patterns include input signals having different levels according to the edge signal. The remaining and developed patterns are thereafter combined to form a new truth table model to be used in the simulation. When the truth table model has reference to a self-output value, a new table is formed that includes a virtual memory.

10 Claims, 10 Drawing Sheets

Fig.5

| input | | | | output |
|---|---|---|---|---|
| PR | CL | CK | D | Q |
| L | H | * | * | H |
| H | L | * | * | L |
| H | H | ↑ | L | L |
| H | H | ↑ | H | H |

| input | | output | |
|---|---|---|---|
| S | CK | EQ | XQ |
| * | ↑ | S | not S |

| input | | output |
|---|---|---|
| A | B | Q |
| L | L | Q |
| L | H | L |
| H | L | H |
| H | H | not Q |

42

| input | output1 | output2 |
|-------|---------|---------|
| ↑ | (input) | (input) |

⇒

| input | memory | output1 | output2 |
|-------|--------|---------|---------|
| L | (input) | un-changed | un-changed |
| H | un-changed | (memory) | (memory) |

53 → (left table); 53A → (right table)

```
%    A    B    C    |   M₁   /   Q   |   M₂    %
     0    1   [01]  |    *   /   X   |  (@B)   ,
     0    *   [10]  |    *   /   =   |   =     ,
```
         state of       before      status of    after
         input pin      memory      output pin   memory
                        change                   change

55

```
           %     i n p u t    / output %
           %   PR   CL   CK    D   /   Q    %
TRUTH:         0    1    *     *   /   1    ,
               1    0    *     *   /   0    ,
               1    1   [01]   0   /   0    ,   ← 56A
               1    1   [01]   1   /   1    ,   ← 56B
ENDTRUTH ;
```

```
%      i n p u t         /    output    %
% PR  CL  CK  D   |  Mq₁  /   Q   |  Mq₂  %
   1   1   0   0  |   *   /   =   |   0    ,
   1   1   1   0  |   *   /  (Mq₂)|   =    ,
   1   1   0   1  |   *   /   =   |   1    ,
   1   1   1   1  |   *   /  (Mq₂)|   =    ,
```

```
%      i n p u t         /    output    %
% PR  CL  CK  D   |  Mq₁  /   Q   |  Mq₂  %
   1   1   0   X  |   *   /   =   |   =    ,
   1   1   1   X  |   *   /   =   |   =    ,
   1   1   X   0  |   *   /   =   |   =    ,
   1   1   X   1  |   *   /   =   |   =    ,
   1   1   X   X  |   *   /   =   |   =    ,
```

```
%      i n p u t       /   output   %                        ⟵59
% PR  CL  CK   D  |  Mq  /   Q   |  Mq   %
   0   1   *   *  |   *  /   1   |   1   ,
   1   0   *   *  |   *  /   0   |   0   ,
   1   1   0   0  |   *  /   =   |   0   ,
   1   1   1   0  |   *  / (Mq)  |   =   ,
   1   1   0   1  |   *  /   =   |   1   ,
   1   1   1   1  |   *  / (Mq)  |   =   ,
   1   1   0   X  |   *  /   =   |   =   ,
   1   1   1   X  |   *  /   =   |   =   ,
   1   1   X   0  |   *  /   =   |   =   ,
   1   1   X   1  |   *  /   =   |   =   ,
   1   1   X   X  |   *  /   =   |   =   ,
```

Fig.17

```
            % i n p u t /   output   %      ⟵60
            %    S   CK /   EQ   XQ  %
TRUTH:           *  [01] /  (S)  (@S)  ,
ENDTRUTH ;
```

Fig.21

```
       % input  /output %
       %  A  B  /   Q   %
TRUTH:    0  0  /  (Q)   ,
          0  1  /   0    ,
          1  0  /   1    ,
          1  1  / (@Q)   ,
ENDTRUTH ;
```

Fig.22

```
%    input    / output      %
%  A  B | Mq₁  /  Q  | Mq₂   %
   0  0 |  *   / (Mq₁) | (Mq₁) ,
   0  1 |  *   /   0   |   0   ,
   1  0 |  *   /   1   |   1   ,
   1  1 |  *   / (@Mq₁)| (@Mq₁),
```

CELL LIBRARY GENERATING METHOD AND APPARATUS

BACKGROUND OF THE INVENTION

1. Field of the Invention

The present invention relates to generating a cell library which stores various kinds of cell data usable for logic design of semiconductor integrated circuits (ICs), and more particularly, to generating a cell library for use in logic simulation of such designed ICs.

2. Description of the Related Art

A net description model and a truth table model are typically used to represent various cells which are used in the logic design stage of semiconductor ICs. In the net description model, cells are defined by elements to be used and net information which connects those elements to one another. In the truth table model, the function of each cell is expressed by a pattern of input signals and corresponding output signals.

Logic simulation is performed on a designed logic circuit to check whether the general operation of the logic circuit yields results that are consistent with expected values. To support proper simulation, when a designed logic circuit includes cells of a truth table model, the truth table model should not include any signal expression which a logic simulator cannot accommodate.

For example, in general, a logic simulator can handle only level signals having values of "0", "1" and "X" (0 or 1) as input signals to cells which constitute a logic circuit. However, typically the expressions of input signals in a truth table model include not only level signals of "0" and "1" but also edge signals, which shows a change in a signal value, i.e., a rising edge and a falling edge. For instance, an edge-signal in a truth table model might correspond to a flip-flop which has a memory function. The expressions of a truth table model corresponding to such a flip-flop include an expression such that for a new input signal value, the signal value of at least one output pin is based on the previous output value.

Therefore, a cell designer typically manually rewrites the edge signals of a truth table model as level signals. At that time, the cell designer would also need to manually add a memory function.

In addition, when a truth table model which refers to a previous output value is present, the cell designer must manually rewrite the truth table model in order to clearly show a memory for holding the previous output value.

Because the aforementioned rewriting of a truth table model is performed manually, this task demands a considerable amount of time and effort of the cell designer. Moreover, the manual rewriting process of the truth table model is likely to contain errors.

SUMMARY OF THE INVENTION

The present invention pertains to facilitating logic simulation of a semiconductor integrated circuit which includes cells of a truth table model expressed with edge signals. The invention operates to convert the truth table model expressed by the edge signals to a truth table expressed by level signals in the process of generating a cell library. The invention further operates to convert a truth table which has reference to a self-output value so that manual addition of a memory is not required for simulation.

According to an embodiment of this invention, a cell library generating method generates a cell library to be used in a logic simulator by combining patterns including input signals and output signals. The generated library includes information on a plurality of cells whose functions are expressed in accordance with a truth table model. This method includes an operation of inputting to the logic simulator information contained in each cell of a truth table model. In a selecting step, it is first determined if an input signal to each cell includes an edge signal indicative of rising or falling of that input signal. According to this determination, a pattern including the edge signal is thereby selected. In a developing step, the selected pattern is separated from the truth table model of the cell and is developed into two patterns. The developed two patterns include input signals having different levels corresponding to the edge signal. The method further includes a step for determining whether the input truth table model refers to a previous output value, in which case a new truth table model is developed without having to add a memory function to hold the previous output value. The method also may be programmed to be stored on a computer-readable medium.

The present invention also pertains to a cell library generating apparatus. The generating apparatus comprises a device for determining if a signal input to a logic simulator, includes an edge signal indicative of rising or falling of that input signal, and thereby selecting a pattern including the edge signal. The generating apparatus further includes a device for separating the selected pattern from a truth table of the cell and developing the separated pattern into two patterns. The developed two patterns include input signals having different levels corresponding to the edge signal.

BRIEF DESCRIPTION OF THE DRAWINGS

The invention, together with objects and advantages thereof, may best be understood by reference to the following detailed description and the accompanying drawings in which:

FIG. 5 is an explanatory diagram showing a truth table model;

FIG. 6 is an explanatory diagram showing another truth table model;

FIG. 7 is an explanatory diagram showing a further truth table model with reference to a self-output value;

FIG. 14 shows a truth table model obtained by converting an effective edge using the internal expression pattern depicted in FIG. 12;

FIG. 15 shows a truth table model obtained by converting an invalid edge using the internal expression pattern depicted in FIG. 12;

FIG. 16 is an explanatory diagram illustrating a truth table model after conversion;

FIG. 17 shows a truth table model obtained by converting the truth table in FIG. 6 using the internal expression pattern depicted in FIG. 12;

FIG. 21 shows a truth table model obtained by converting the truth table in FIG. 7 using the internal expression pattern depicted in FIG. 12; and FIG. 22 is an explanatory diagram illustrating a truth table model after conversion.

DETAILED DESCRIPTION OF THE PREFERRED EMBODIMENTS

An embodiment of the present invention will now be described with reference to the accompanying drawings.

Figure 1:
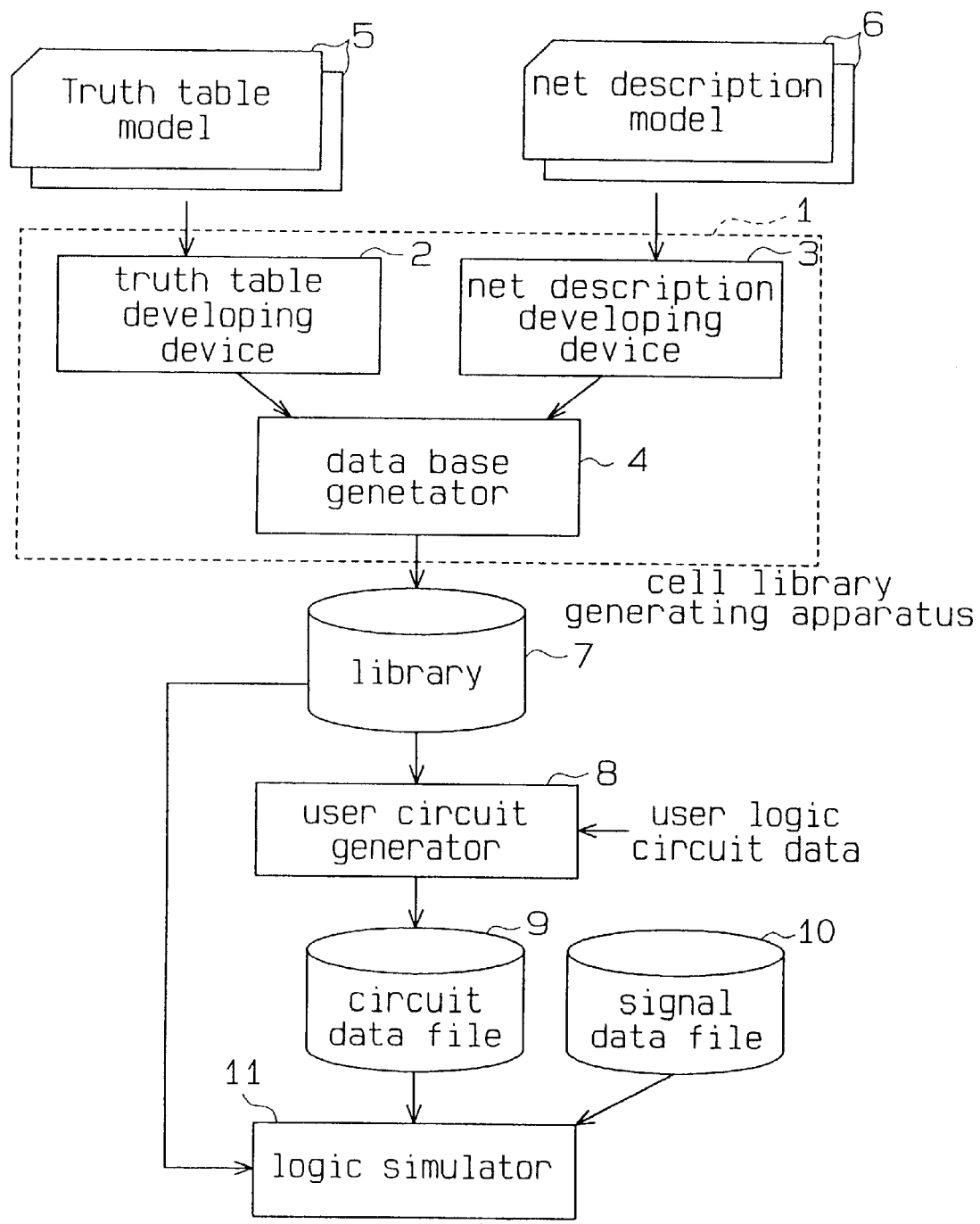
FIG. 1 is a diagram of a logic simulation system according to one embodiment of this invention.

FIG. 1 illustrates a logic simulation system which comprises a cell library generating apparatus 1, a library 7, a user circuit generator 8, a circuit data file 9, a signal data file 10 and a logic simulator 11.

The cell library generating apparatus 1 includes a truth table developing device 2, a net description developing device 3 and a data base generator 4.

The truth table developing device 2 receives a truth table model 5 expressing various cells, and converts this model 5 into a form which can be accommodated by the data base generator 4. In such a truth table model, the function of each cell is expressed by a pattern of input signals and output signals. As examples, FIGS. 5 to 7 illustrate several truth table models 40, 41 and 42 respectively.

The truth table model 40 in FIG. 5 represents a cell having a memory function (not illustrated) of a flip-flop or similar device. For the signal value of an input pin CK, an edge signal indicating a change in that signal value (represented by the upward arrow) is used. The truth table model 41 in FIG. 6 likewise represents a cell having a memory function (not illustrated). An edge signal (represented by the upward arrow) is used for the signal value of the input pin CK.

The truth table model 42 in FIG. 7 also represents a cell having a memory function (not illustrated). For a new input signal value, the signal value of an output pin Q refers to the previous output value. Specifically, in this example, when inputs to two input pins A and B are at L (Low) levels, the output Q holds its output value. In such a case, the truth table model is defined as having "reference to a self-output value". In other words, "reference to a self-output value" means that when a specific input signal has been input to a cell, the output signal is held at the same level as the output signal before the input of the specific input signal.

The net description developing device 3 shown in FIG. 1 receives a net description model 6 and converts this input into a form which the data base generator 4 can accommodate. A net description model includes a plurality of elements to be used and net information for connecting those elements to one another.

The database generator 4 receives a truth table model converted by the truth table developing device 2 and a net description converted by the net description developing device 3, generates library files based on the inputs from each of the developing devices 2,3 and registers those library files in the library 7.

The user circuit generator 8 reads, from the library 7, data of a cell which is specified by user logic circuit data including a net list prepared by a user. Based on the acquired data, the user circuit generator 8 prepares a cell layout and interconnects cells to generate circuit data. The generated user circuit data is registered in the circuit data file 9.

The logic simulator 11 reads user circuit data from the circuit data file 9 and test pattern data from the signal data file 10. When a truth table model is used to read the user circuit data, the logic simulator 11 reads this truth table model from the library 7. In accordance with data read, the logic simulator 11 executes logic simulation to examine if the operation of the user circuit produces values that match expected values.

Figure 2:
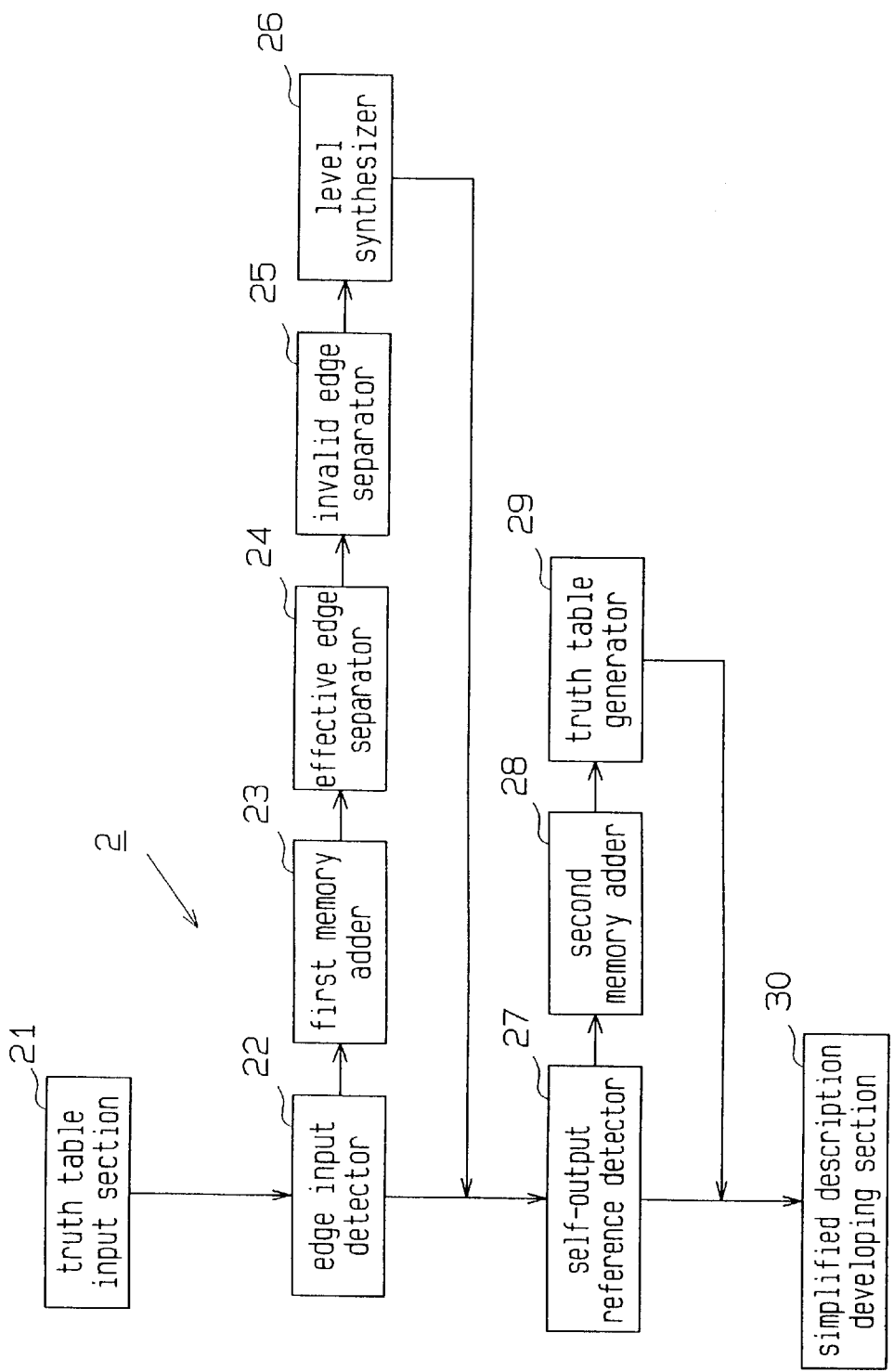
FIG. 2 is a block diagram showing a truth table developing device according to the embodiment depicted in FIG. 1.

As shown in FIG. 2, the truth table developing device 2 of FIG. 1 has a truth table input section 21, an edge input detector 22, a first memory adder 23, an effective edge separator 24, an invalid edge separator 25, a level synthesizer 26, a self-output reference detector 27, a second memory adder 28, a truth table generator 29 and a simplified description developing section 30.

Figures 11, 12, 13:
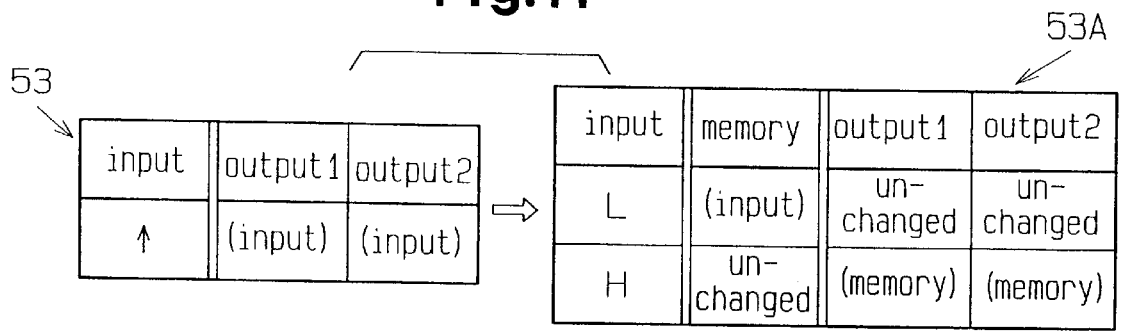
FIG. 11 is a principle diagram showing the optimization of the number of memories.
FIG. 12 is an explanatory diagram showing an internal expression pattern for use in the conversion of a truth table model.
FIG. 13 shows a truth table model obtained by converting the truth table in FIG. 5 using the internal expression pattern depicted in FIG. 12.

The truth table input section 21 in FIG. 2 receives a truth table model and converts this truth table model in accordance with an internal expression pattern 55 shown in FIG. 12. In the internal expression pattern 55 of FIG. 12, "A", "B" and "C" denotes input pins, "M" in reference symbols "M1" and "M2" denotes one virtual memory, and the numerals "1" and "2" in those symbols relate values before and after a status change in the virtual memory M. "Q" indicates an output pin. The numerals "0" and "1" and the letter "X" indicate signal values (levels) where X is either 0 or 1. The symbol "*" indicates an arbitrary signal value in 0, 1 and X. [01] and [10] indicate an edge signal; the left value in the bracket is a signal value before change in level while the right value is a signal value after change in level. The symbol "=" indicates "no output change". "(B)" indicates the signal value of the pin having the letter within the parentheses, and "(@B)" indicates the inverted value of the signal value of the pin having the letter within the parentheses. The symbol "%" appearing in FIG. 12 and subsequent Figures indicates the beginning or ending of a comment line.

Figure 3:
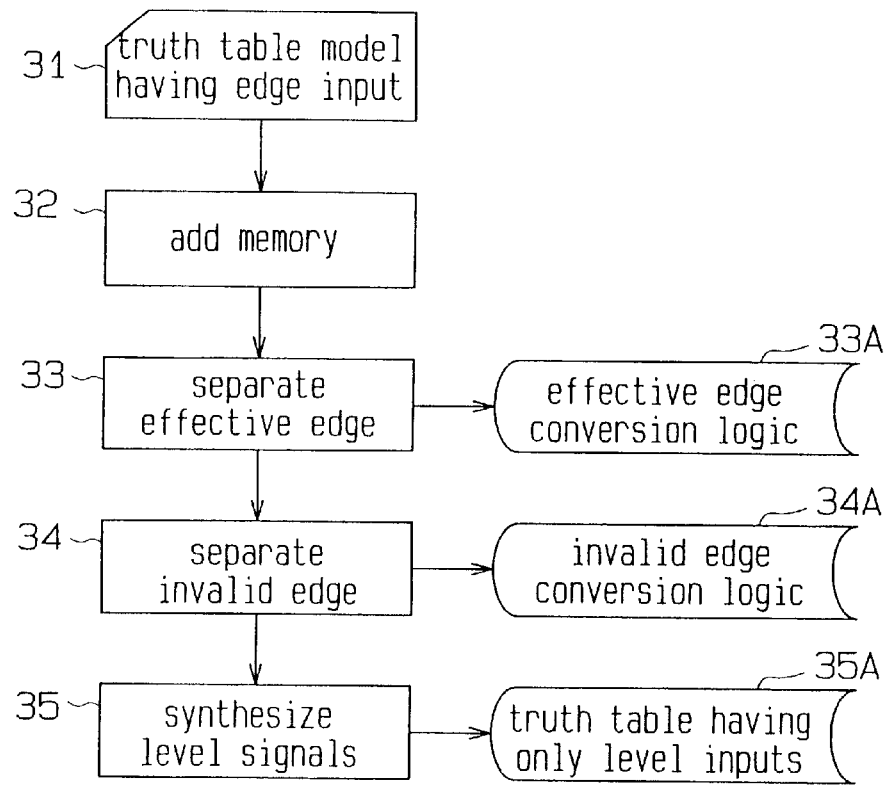
FIG. 3 is a flowchart illustrating a process of converting an edge signal to a level signal.

The edge input detector 22 shown in FIG. 2 performs a process 31 illustrated in FIG. 3, through which a truth table model having edge inputs is input to the edge input detector 22. When the edge input detector 22 determines that a truth table model contains an edge signal, the first memory adder 23 in FIG. 2 performs a process 32 to add a virtual memory as illustrated in FIG. 3. In such a case, a single virtual memory is added with respect to one output pin.

The effective edge separator 24 shown in FIG. 2 executes an effective edge separation process 33 illustrated in FIG. 3. When the signal value of the output varies based on the input of an edge signal, this edge signal is called "effective edge". In such a case, the separation process 33 separates or divides the edge signal into two input logic patterns, namely a level signal before change and a level signal after change, thereby generating an effective edge conversion logic 33A.

Figure 8:
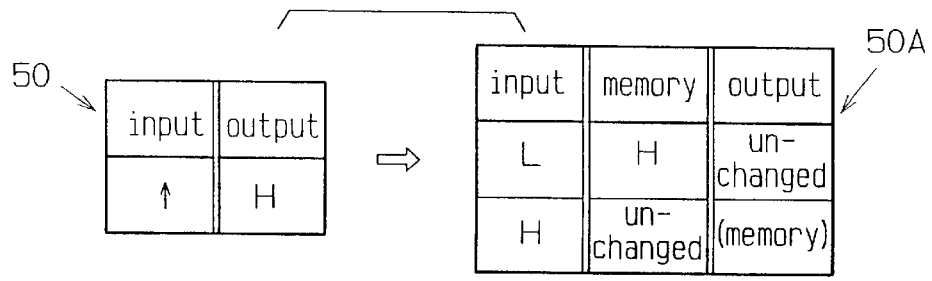
FIG. 8 is a diagram illustrating the separation of an effective edge.

FIG. 8 illustrates the principle of converting an edge signal when the input to a truth table model 50 having one input and one output is the edge signal which is an effective edge. Because the truth table model 50 contains an edge signal, a truth table model 50A is generated having a virtual memory added by the memory adder 23. Since the level of the output is changed to H (High) by the rising edge signal in FIG. 8, the effective edge separator 24 converts the edge signal to two input logic patterns, a level signal "L" before level change and a level signal "H" after level change.

In this case, with regard to the level signal input "L" before level change, the output "H" of the truth table model 50 before conversion is used for a virtual memory and "unchanged" is set for the output, as indicated in the truth table model 50A after conversion. Regarding the level signal input "H" after level change, "unchanged" is used for a virtual memory and the memory value before level change ("H") is set for the output.

FIG. 11 illustrates the principle of converting an edge signal when the input to a truth table model 53 having one input and two outputs is the edge signal which is an effective edge. Because the truth table model 53 contains an edge signal, a truth table model 53A having a virtual memory added by the memory adder 23 is generated. In this case, since the outputs 1 and 2 both refer to the single input, only one virtual memory is added. In FIG. 11, the outputs 1 and 2 are changed to the value of the "input" by the rising edge signal. Therefore, the effective edge separator 24 converts the edge signal to two input logic patterns, a level signal input "L" before level change and a level signal input "H" after level change.

In this case, with regard to the level signal input "L" before level change, the output of the truth table model 53 before conversion, i.e., "input", is used for a virtual memory and "unchanged" is set for the outputs 1 and 2, as indicated in the truth table model 53A after conversion. With respect to the level signal input "H" after level change, "unchanged" is set for a virtual memory and the memory value corresponding to the level signal input "L" before level change, i.e., "input", is set for the outputs 1 and 2.

The invalid edge separator 25 shown in FIG. 2 executes an invalid edge separation process 34 illustrated in FIG. 3. When the signal value of the output does not change based on the input of an edge signal, this edge signal is called an "invalid edge". In this case, the separation process 34 is performed to separate the edge signal to two input logic patterns, namely a level signal before change and a level signal after change, thereby generating an invalid edge conversion logic 34A shown in FIG. 3.

Figure 9:
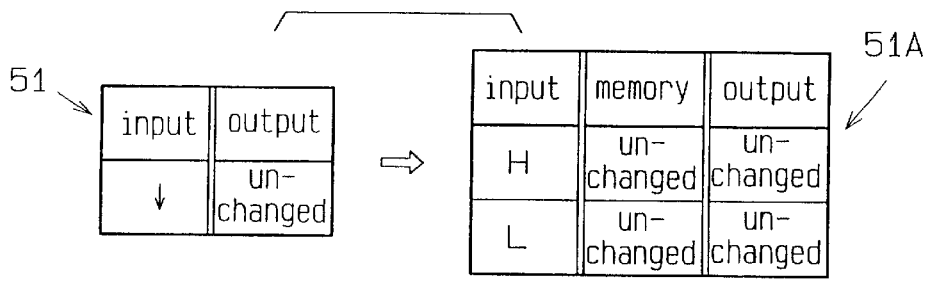
FIG. 9 is a diagram illustrating the separation of an invalid edge.

FIG. 9 illustrates the principle of converting an edge signal when the input to a truth table model 51 having one input and one output is an invalid edge. Because the truth table model 51 contains an edge signal, a truth table model 51A having a virtual memory added by the memory adder 23 is generated. In the truth table model 51 in FIG. 9, even when a falling edge signal is input, the output is kept "unchanged". This edge signal is therefore determined to be an invalid edge, and is converted by the invalid edge separator 25 to two input logic patterns, namely a level signal input "H" before level change and a level signal input "L" after level change.

In this case, with respect to the level signal input "H" before level change, the output of the truth table model 51 before conversion, i.e., "unchanged", is used for a virtual memory and "unchanged" is also set for the output, as indicated in the truth table model 51A after conversion. Regarding the level signal input "L" after level change, "unchanged" is set for a virtual memory and the memory value corresponding to the level signal input "H" before level change, i.e., "unchanged", is set for the output.

The level synthesizer 26 in FIG. 2 performs a level signal synthesizing process 35 illustrated in FIG. 3.

Accordingly, the effective edge conversion logic 33A and the invalid edge conversion logic 34A are synthesized in this order to thereby generate a truth table 35A containing only level inputs.

Figure 4:
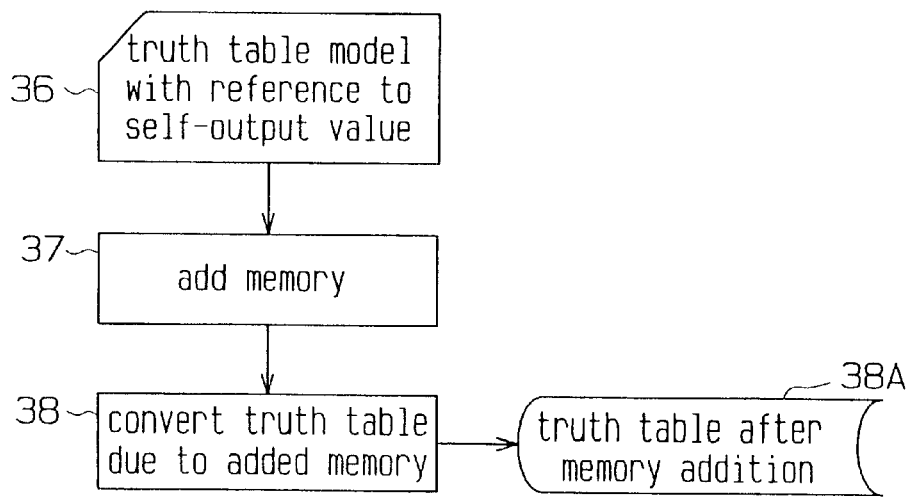
FIG. 4 is a flowchart illustrating a process of adding a memory function to a truth table.

The self-output reference detector 27 in FIG. 2 performs a process 36 of inputting a truth table model with reference to a self-output value, as shown in FIG. 4. When a truth table model has reference to a self-output value, the second memory adder 28 in FIG. 2 performs a process 37 for adding a virtual memory to the truth table model as shown in FIG. 4. In this case, a single memory is added for one output pin.

Figure 10:
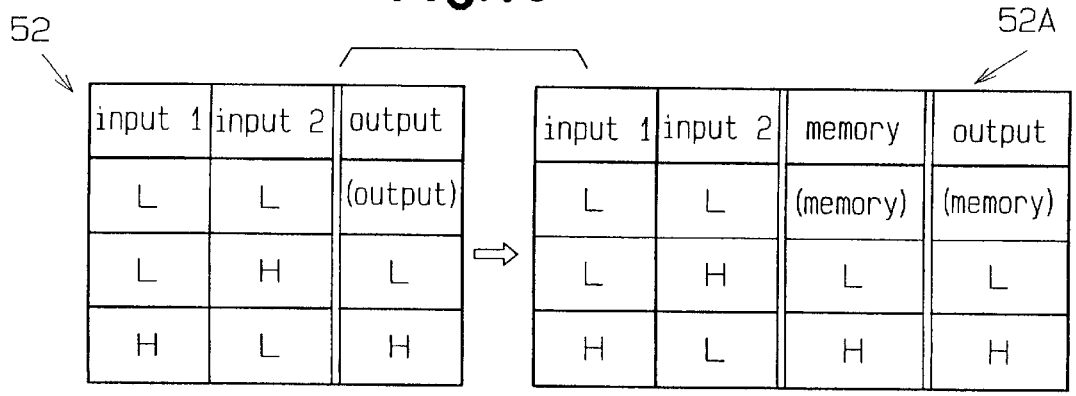
FIG. 10 is a diagram showing conversion of a truth table which involves memory addition.

The truth table generator 29 in FIG. 2 performs a truth table conversion process 38 after the memory adding process 37 to generate a memory-added truth table 38A, as shown in FIG. 4. FIG. 10 shows a conversion principle which is executed by the truth table generator 29 with respect to a truth table model having two inputs and one output. According to this conversion principle, because the output in the pattern in the first row in a truth table model 52 has reference to a self-output value, a virtual memory is added to the truth table model 52 by the memory adder 28, thereby generating a truth table model 52A. As indicated by the pattern of the first row in the truth table model 52A, a self-output value existing before new input signals are input to the input pins 1 and 2, i.e., the value of the memory, is used for the virtual memory and the output.

It is to be noted that when an edge signal is an invalid edge, the simplified description developing section 30 in FIG. 2 generates patterns with unchanged outputs associated with that invalid edge as shown in, for example, FIG. 15.

When the truth table model 40 shown in FIG. 5 is input to the truth table developing device 2 of FIGS. 1 and 2, this truth table model 40 is converted to a truth table model 56 shown in FIG. 13 in accordance with the internal expression pattern 55 shown in FIG. 12. Although no invalid edges are illustrated in FIG. 13, a specific example of an invalid edge is as follows:

| PR | CL | CK | D | / | Q |
|---|---|---|---|---|---|
| 1 | 1 | [10] | * | / | "unchanged" |

Because a pattern 56A in the third row and a pattern 56B in the fourth row in the truth table model 56 have effective edges, patterns 57 having one virtual memory Mq added are generated as shown in FIG. 14. A memory value Mq1 before status change is set to the input side, while a memory value Mq2 after status change is set to the output side.

The third row pattern 56A having an effective edge in FIG. 13 is converted to input logics 57A1 and 57A2 respectively in the first and second rows in FIG. 14. The first row input logic 57A1 is equivalent to the level signal "0" before the level change of the effective edge and the second row input logic 57A2 is equivalent to the level signal "1" after the level change of the effective edge.

The first row input logic 57A1 is set such that every signal value "*" can be the value of the memory Mq1 before status change, and such that a value (0 in this case) for the output Q is set as the value of the memory Mq2 after status change. The second row input logic 57A2 is set such that the value of the memory Mq2 after status change in the input logic 57A1 is set to the output Q. As a result, the effective edge is separated to two logic patterns based on a pattern of level signals.

The fourth row pattern 56B having an effective edge in FIG. 13 is converted to input logic patterns 57B1 and 57B2 respectively in the third and fourth rows in FIG. 14. The third row input logic 57B1 is equivalent to the level signal "0" before level change of the effective edge and the fourth row input logic 57B2 is equivalent to the level signal "1" after level change.

The third row input logic 57B1 is set such that every signal value "*" can be the value of the memory Mq1 before status change, and such that a value (1 in this case) for the output Q is set as the value of the memory Mq2 after status change. The fourth row input logic 57B2 is set such that the value of the memory Mq2 after status change in the input logic 57B1 is set to the output Q. As a result, the effective edge is separated into two logic patterns.

When an invalid edge "[10]" is input to the input pin CK, the values of the input pins PR and CL are both "1" and the output Q is "unchanged" in the patterns 56 shown in FIG. 13. Further, as shown in FIG. 15, for example, patterns 58 with the unchanged output corresponding to the invalid edge are generated in accordance with the fixed values of the input pins PR and CL.

Subsequently, the two patterns in the first and second rows of the truth table model 56 in FIG. 13, which do not contain an edge, the patterns 57 associated with an effective edge shown in FIG. 14 and the patterns 58 with the unchanged output shown in FIG. 15 are synthesized in the named order, thereby generating a truth table model 59 shown in FIG. 16. By inputting this truth table model 59 in the form of a database to the logic simulator 11, a truth model having edge signals can be simulated.

Figure 18:
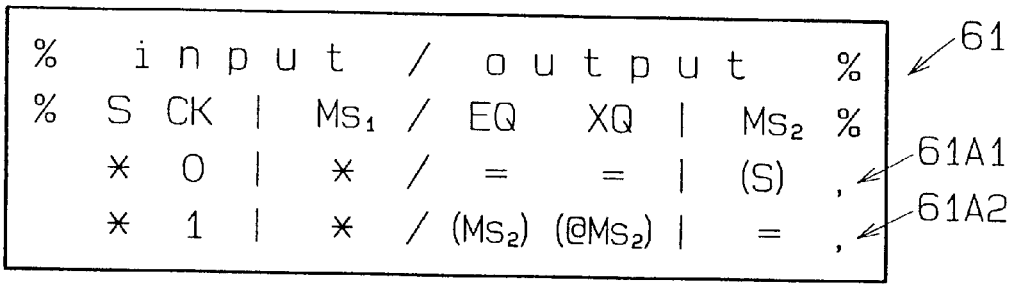
FIG. 18 shows a truth table model obtained by converting an effective edge in FIG. 17 using the internal expression pattern depicted in FIG. 12.

FIG. 17 illustrates a truth table model 60 which is obtained by converting the 2-input and 2-output truth table model 41 shown in FIG. 6 in accordance with the internal expression pattern 55 shown in FIG. 12. Because the pattern of the truth table model 60 includes an effective edge, patterns 61 having one memory added are generated as shown in FIG. 18. At this time, a memory value Ms1 before status change is set to the input side, while a memory value Ms2 after status change is set to the output side. The patterns 61 include two input logic patterns, namely an input logic 61A1 for the level signal "0" before level change of the effective edge and an input logic 61A2 for the level signal "1" after level change.

The first row input logic 61A1 shown in FIG. 18 is set such that every signal value "*" can be the value Ms1 before level change, and such that a value for the output EQ (S in this case) is set as the value of the memory Ms2 after level change. The second row input logic 61A2 is set such that the value of the memory Ms2 after level change is output to the output EQ, and the inverted value of the memory value Ms2 after level change is output to the output XQ. In this way, the effective edge is separated.

Figure 19:
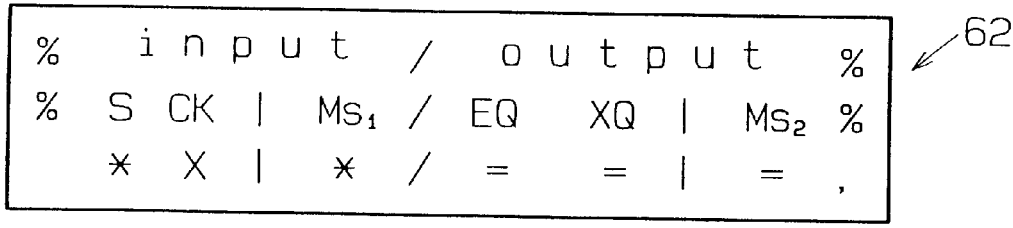
FIG. 19 shows a truth table model obtained by converting an invalid edge using the internal expression pattern depicted in FIG. 12.

When the edge signal is an invalid edge, patterns 62 with the unchanged output which correspond to such an edge signal are generated, as shown in FIG. 19.

Figure 20:
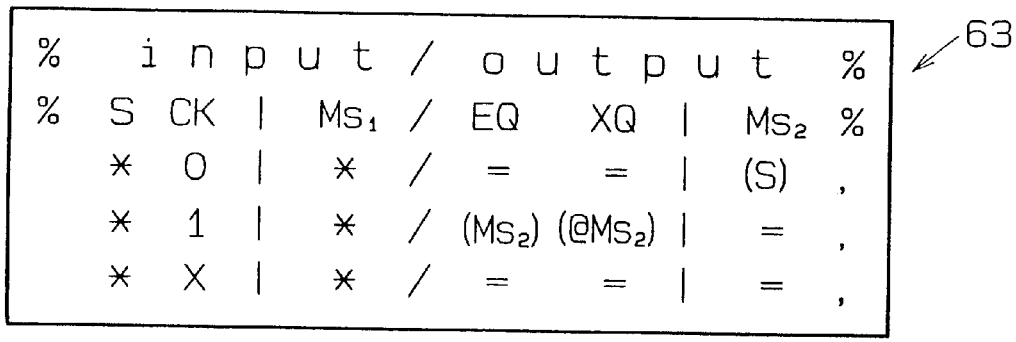
FIG. 20 is an explanatory diagram illustrating a truth table model after conversion.

The patterns 61 shown in FIG. 18 and the patterns 62 with the unchanged output shown in FIG. 19 are synthesized in the named order, generating a truth table model 63 shown in FIG. 20. This example does not require two memories even though there are two outputs. This is because the signal values of the two outputs EQ and XQ are determined by the signal value of one input (S). This example requires a single additional memory and thus can avoid an increase in the number of memories.

FIG. 21 illustrates a truth table model 65 which is obtained by converting the 2-input and 1-output truth table model 42 shown in FIG. 7 in accordance with the internal expression pattern 55 shown in FIG. 12. Because the first row pattern in the truth table model 65 includes reference to a self-output value, a truth table model 66 having one memory Mq added is generated as shown in FIG. 22. The symbol "Mq1" indicates the value on the input side, or the memory value before status change, and "Mq2" indicates the value on the output side, or the memory value after status change.

Each pattern is set such that every signal value "*" can be the memory value Mq1 before level change, and that the memory value Mq1 before level change is set for the output Q and the memory value Mq2 after level change.

Because this truth table model 66 is input in the form of a database to the logic simulator 11, a truth table model referring to a self-output value can be simulated.

According to this invention, as discussed above, the automatic addition of a virtual memory can eliminate the use of a memory for retaining a previous output value from a truth table model. Further, the invention allows an edge signal in a truth table model to be directly expressed by level signals, thus reducing a burden on a cell designer to manually modify the original truth table.

Furthermore, an edge signal input is developed, and a truth table model containing only level signal inputs is generated and formed into a database. This feature allows even a logic simulator, which cannot handle edge signals, to properly simulate a truth table model which includes edge signals.

It should be apparent to those skilled in the art that the present invention may be embodied in many other specific forms without departing from the spirit or scope of the invention. Therefore, the present examples and embodiments are to be considered as illustrative and not restrictive and the invention is not to be limited to details given herein, but may be modified within the scope and equivalence of the appended claims.

I claim:

1. A method for producing a cell library for use with a logic simulation apparatus, said cell library including information on a plurality of cells, each cell having a function represented in accordance with a truth table model as a combination of a plurality of patterns, each pattern including an input signal and an output signal, and method comprising the steps of:

providing the information of each cell to the logic simulation apparatus;

determining whether the input signal of the patterns of the cell include edge signals including a rising edge signal or a falling edge signal;

selecting the patterns that are determined to include the edge signals;

separating the selected patterns from the truth table model of the cell;

developing each of the selected patters into two associated patterns, the two associated patterns include associated input signals different from each other in level in accordance with the edge signals; and adding a virtual memory to each of the developed associated patterns.

2. A method according to claim 1, wherein when the input signal of the pattern includes the rising edge signal and the output signal goes high in response to the rising edge signal, the associated input signals of the developed patterns are set at low and high, respectively, and wherein the virtual memories in the developed patterns receive data representing a high level output signal and data representing that the output signal is unchanged, respectively.

3. A method according to claim 1, wherein when the input signal includes the falling edge signal and the output signal is unchanged in response to the falling edge signal, the associated input signals of the developed patterns are set at high and low, respectively, and wherein the virtual memories in the developed patterns receive data representing that the output signals are unchanged.

4. A method according to claim 1 further comprising a step of combining the developed pattern with patterns remaining in the truth table model to rebuild the truth table containing signals expressing high or low level.

5. A method for producing a cell library for use with a logic simulation apparatus, said cell library including information on a plurality of cells, each cell having its function represented in accordance with a truth table model as the combination of a plurality of patterns each pattern including an input signal and an output signal, said method comprising the steps of:

providing the information of each cell to the logic simulation apparatus;

determining whether the output signal of the cell includes a self-output reference, the self-output reference causing an output signal to remain at the same level as a previous output signal before the input signal was provided;

selecting the pattern including the self-output reference; and adding a virtual memory to each of the selected patterns.

6. An apparatus for producing a cell library for use with a logic simulation apparatus, said cell library including information on a plurality of cells, each cell having a function represented by a combination of a plurality of patterns, each pattern including an input signal and an output signal, said apparatus comprising:

a pattern selector for determining whether the input signal of the cell includes edge signals including a rising edge signal or a falling edge signal when the information of each cell is provided to the logic simulation apparatus, and for selecting the pattern including the rising edge signal or the falling edge signal;

a pattern developing device for separating the selected pattern from the truth table model of the cell, developing the selected pattern into two associated patterns, the developed patterns including associated input signals different from each other in level in accordance with the edge signals and for adding a virtual memory to each of the developed patterns.

7. An apparatus according to claim 6, wherein when the input signal of the pattern includes the rising edge signal and the output signal goes high in response to the rising edge signal, the pattern developing device sets the associated input signals of the developed patterns to be at low and high, respectively, and wherein the pattern developing device causes the virtual memories in the developed patterns to receive data representing a high level output signal and data representing that the output signal is unchanged, respectively.

8. An apparatus according to claim 6, wherein when the input signal includes the falling edge signal and the output signal is unchanged in response to the falling edge signal, the pattern developing device sets the associated input signals of the developed patterns to be at high and low, respectively, and wherein the pattern developing device causes the virtual memories in the developed patterns to receive data representing that the output signals are unchanged.

9. An apparatus according to claim 6 further comprising a rebuilding device for combining the developed pattern with patterns remaining in the truth table model to rebuild the truth table containing signals having high or low levels.

10. A computer-readable medium for storing a program that develops a cell library for use with a logic simulation apparatus, said cell library including information on a plurality of cells, each cell having a function represented in accordance with a truth table model as a combination of a plurality of patterns, each pattern including an input signal and an output signal, said program comprising:

program code for determining whether the input signal or the patterns of the cell includes edge signals including a rising edge signal or a falling edge signal when the information of each cell is provided to the logic simulation apparatus;

program code for selecting the patterns that are determined to include the rising edge signal or the falling edge signal;

program code for separating the selected patterns from the truth table mode of the cell;

program code for developing the selected pattern into two associated patterns including associated patterns including associated input signals different from each other in level in accordance with the edge signals; and program code for adding a virtual memory to each of the developed associated patterns.

* * * * *

UNITED STATES PATENT AND TRADEMARK OFFICE
CERTIFICATE OF CORRECTION

PATENT NO.    : 6,035,112
DATED         : March 7, 2000
INVENTOR(S)   : Nobuyuki KITO It is certified that an error appears in the above-identified patent and that said Letters Patent is hereby corrected as shown below:

On the Title Page:
[73] change "LIMTED" to --LIMITED--.

Signed and Sealed this

Twenty-seventh Day of March, 2001

Attest:

NICHOLAS P. GODICI

Attesting Officer

*Acting Director of the United States Patent and Trademark Office*